(12) United States Patent
Ishihara

(10) Patent No.: US 6,197,631 B1
(45) Date of Patent: Mar. 6, 2001

(54) SEMICONDUCTOR STORAGE DEVICE WITH A CAPACITOR USING A FERROELECTRIC SUBSTANCE AND FABRICATING METHOD THEREOF

(75) Inventor: Kazuya Ishihara, Souraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/168,235

(22) Filed: Oct. 7, 1998

(30) Foreign Application Priority Data

Oct. 7, 1997 (JP) .................................... 9-274329

(51) Int. Cl.⁷ ...................... H01L 21/00; H01L 21/8242
(52) U.S. Cl. ................................. 438/240; 438/3
(58) Field of Search .................. 438/240, 3, 393, 438/396, 239, 238

(56) References Cited

U.S. PATENT DOCUMENTS

| | | | |
|---|---|---|---|
| 4,460,412 | * | 7/1984 | Imura et al. ............... 148/1.5 |
| 5,407,855 | * | 4/1995 | Maniar et al. .............. 437/60 |
| 5,663,088 | * | 9/1997 | Sandhu et al. ............. 438/396 |
| 5,864,932 | * | 2/1999 | Evans et al. .............. 29/25.42 |
| 5,874,755 | * | 2/1999 | Ooms et al. .............. 257/295 |

FOREIGN PATENT DOCUMENTS

| | | |
|---|---|---|
| 0 513 894 A2 | 11/1992 | (EP) . |
| 5-183106 | 7/1993 | (JP) . |
| 7-273297 | 10/1995 | (JP) . |

OTHER PUBLICATIONS

The 52nd Symposium of Semiconductor and Integrated Circuit Technology, Memoirs, Jun. 12 and 13, 1997, Osaka International Communication Center, Convener: Electronic Material Committee of Electrochemical Society, "Process Integration of $SrBi_2Ta_2O_9$ Ferroelectric capacitors," bt Keisuke Tanaka et al., pp: 153–158.

* cited by examiner

*Primary Examiner*—Richard Elms
*Assistant Examiner*—Adam Pyonin
(74) *Attorney, Agent, or Firm*—Morrison & Foerster LLP

(57) ABSTRACT

In a fabricating method of a semiconductor storage device, a ferroelectric film is formed on a lower electrode, and crystallized. Thereafter, a heat treatment is performed in an atmosphere of hydrogen or a mixture of hydrogen and an inert gas to vanish a defect at the interface between the gate insulating film of a MOS transistor and a silicon substrate. Next, an upper electrode is formed on the ferroelectric film.

7 Claims, 3 Drawing Sheets

US 6,197,631 B1

SEMICONDUCTOR STORAGE DEVICE WITH A CAPACITOR USING A FERROELECTRIC SUBSTANCE AND FABRICATING METHOD THEREOF

BACKGROUND OF THE INVENTION

The present invention relates to a semiconductor storage device and fabricating method thereof, and more particularly, to a semiconductor storage device and fabricating method thereof provided with a capacitor that uses a ferroelectric substance as a dielectric film.

A prior art non-volatile memory that uses a ferroelectric substance is shown in FIG. 3. The prior art ferroelectric memory is constructed of at least one switching transistor and at least one ferroelectric capacitor. Similar to the CMOS (Complementary Metal Oxide Semiconductor) process of the conventional DRAM (Dynamic Random Access Memory), after forming a switching transistor in an active region surrounded by an element isolation region and forming a lower electrode corresponding to a drive line on the element isolation region, a ferroelectric substance is formed. The ferroelectric capacitor exhibits a hysteretic behavior of charged electrons with respect to an application electric field.

The ferroelectric film has a spontaneous polarization even though the application electric field is removed, and therefore, information (1 or 0) is stored depending on the direction of this polarization. Taking advantage of this property, a non-volatile memory capable of retaining the information when the power supply is turned off can be achieved. For the application of the ferroelectric capacitor to a memory, there is necessitated about 5 $\mu C/cm^2$ charge on the capacitor since positive and negative threshold voltages for inverting the polarization are equal to each other and a difference between the amount of inverted charges and the amount of non-inverted charges is detected by a sensing amplifier of a semiconductor memory.

After forming the ferroelectric capacitor, there are simultaneously processed an upper plate electrode, a PZT film and a drive line into respective specified shapes. A bit line is electrically connected to one source/drain region, while the other source/drain region is electrically connected to a plate electrode of the ferroelectric capacitor by way of wiring.

For the ferroelectric substance, there is employed lead zirconate titanate ($PbZr_xTi_{1-x}O_3$, referred to as PZT hereinafter), bismuth layered compound ($SrBi_4Ti_4O_{15}$, $SrBi_2Ta_2O_9$) or the like as a material that satisfies the aforementioned characteristics. For the electrode material, there are employed PtRh and $PtRhO_x$ that have a good lattice bondability to the PZT film and an excellent oxidation resistance or $RuO_2$, $IrO_2$ and LaSrCoO that are oxides and have the feature of electrical conductivity. After the formation of the ferroelectric capacitor, an interlayer insulating film is formed and the elements are interconnected by means of metal wiring. For the interlayer insulating film, there is employed the raw material of silane gas or TEOS (tetraethoxysilane), and a silicon oxide film or a silicon nitride film is formed by the CVD (Chemical Vapor Deposition) method.

A memory provided with a transistor as described above is normally subjected to a heat treatment within a temperature range of 400 to 450° C. in an inert gas atmosphere containing hydrogen after the completion of the final process of metal wiring or protecting film formation. This process is to obtain stable transistor characteristics through a reduction in the interface state density of the gate oxide film by vanishing a defect at the interface between the gate oxide film of the transistor and the substrate with diffused hydrogen.

A prior art technique as disclosed in the prior art reference of Japanese Patent Laid-Open Publication No. HEI 7-273297 will be described below with reference to FIG. 3.

First, an element isolation region 42 is formed on the surface of a semiconductor substrate 41, and thereafter, diffusion regions of a source 43 and a drain 44 and a switching transistor 47 having a gate electrode 46 to be formed on the substrate 41 via a gate insulating film 45 are formed.

Next, a BPSG film (Boro-Phospho Silicate Glass film) 48 is formed as an interlayer insulating film, and further a titanium adhesion layer 49 having a film thickness of 20 nm, a Pt lower electrode 51 having a film thickness of 200 nm, a ferroelectric film 52 having a film thickness of 250 nm and a Pt upper electrode 53 having a film thickness of 200 nm are successively formed on the BPSG film 48. The lower electrode 51, the ferroelectric film 52 and the upper electrode 53 constitute a capacitor 50.

Next, a first protecting film 54 made of silicon oxide comprised of SOG (spin-on glass) is formed to a film thickness of 200 nm, and a second protecting film 55 is formed to a film thickness of 220 nm by application heat treatment of a MOD (Metal Organic Decomposition) solution having the same composition as that of the material of the ferroelectric thin film 52 on the first protecting film 54. The second protecting film 55 is baked under the same processing conditions as those of the ferroelectric film 52.

Further, an interlayer insulating film 56 is formed to a film thickness of 300 nm on the second protecting film 55 by silane thermal decomposition achieved by LPCVD (Low Pressure Chemical Vapor Deposition). Openings 57 are formed through the first protecting film 54, the second protecting film 55, the interlayer insulating film 56 and the BPSG film 48, which are corresponding to the source 43 and the drain 44 of the switching transistor 47. A source lead wire 58 and a drain lead wire 59 are formed through these openings 57. Openings 57, which are corresponding to the upper electrode 53 and the lower electrode 51, are also formed through the first protecting film 54, the second protecting film 55 and the interlayer insulating film 56. The drain lead wire 59 and an upper electrode lead wire 60 are electrically connected to each other through these openings 57.

After the formation of the capacitor 50, the interlayer insulating film 56 to be employed between the multilayer wiring lines 60, 59 and 58 made of aluminum or the like or the protecting films 54 and 55 to be formed after the completion of the wiring lines must be formed at a substrate temperature of about 400° C. taking the reaction of the aluminum wiring lines 60, 59 and 58 with the silicon substrate 41 and the reliability of the aluminum wiring lines 60, 59 and 58 into consideration. For this reason, the interlayer insulating film 56 and the protecting films 54 and 55 have conventionally been formed of the raw material of silane or TEOS (tetraethoxysilane) by the plasma CVD method capable of forming the films at low temperature.

However, the interlayer insulating film 56 formed of silane or TEOS by the plasma CVD method contains a large amount of hydrogen. The hydrogen is dissociated by heat treatment at a temperature of about 400° C. after the formation of the protecting films 54 and 55, diffused into the elements and activated by the Pt upper electrode 53 of the ferroelectric capacitor 50. When the activated hydrogen reaches an interface of the ferroelectric film 52, a reduction effect occurs on the ferroelectric film 52 side, as a consequence of which oxygen in the film 52 is pulled out to destroy the dielectric property. If this phenomenon progresses, then the ferroelectric characteristic of the ferroelectric film 52 deteriorates to cause an increase in the leak current. Furthermore, the heat treatment is performed in an inert gas atmosphere containing hydrogen after the formation of the upper electrode 53 in the above prior art, and therefore, the deterioration in the ferroelectric characteristic and an increase in the leak current occur similarly.

If a thin film 55 equivalent to the ferroelectric substance in terms of composition and crystalline structure is used as a hydrogen interrupting protecting film, then the protecting film is hard to be flattened. This leads to a problem that a separation from the insulating film on the protecting film occurs and a problem that chemical elements constituting the protecting film diffuse to exert bad influence on the switching transistor or the like.

SUMMARY OF THE INVENTION

Accordingly, an object of the present invention is to provide a semiconductor storage device and fabricating method thereof capable of making compatible stable transistor characteristics with a good capacitor ferroelectric characteristic.

In one aspect of the present invention, a semiconductor storage device fabricating method for fabricating a semiconductor storage device provided with a capacitor that uses a ferroelectric film as a dielectric film and a MOS transistor, comprises the steps of:

forming the ferroelectric film on a lower electrode of the capacitor;

performing a first heat treatment in an atmosphere of hydrogen or a mixture of hydrogen and an inert gas after crystallizing the ferroelectric film so that a defect is vanished at an interface between a gate insulating film of the MOS transistor and a semiconductor substrate; and forming an upper electrode of the capacitor on the ferroelectric film directly or via a contact hole formed through an interlayer insulating film after having performed the first heat treatment.

In another aspect of the present invention, a semiconductor storage device has a capacitor, said capacitor comprising:

a lower electrode;

a ferroelectric film that is formed on the lower electrode and has an upper surface processed by hydrogen; and an upper electrode on the ferroelectric film.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
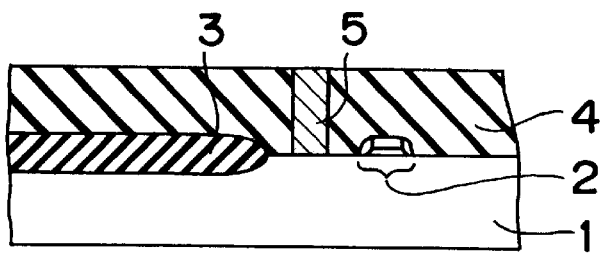
FIGS. 1A, 1B, 1C and 1D are process charts for fabricating a semiconductor storage device according to an embodiment of the present invention.

The present invention will be described in detail below on the basis of the embodiments thereof shown in the accompanying drawings.

FIGS. 1A, 1B, 1C and 1D are process charts for fabricating a semiconductor storage device according to an embodiment of the present invention, in which are shown a semiconductor substrate 1, a switching transistor 2, an element isolation region 3, a first interlayer insulating film 4, a polysilicon plug 5, a barrier metal layer 6, a capacitor lower electrode 7, a ferroelectric film 8, a second interlayer insulating film 9, an upper electrode 10, a third interlayer insulating film 11, a metal wiring 12 and a surface protecting film 13.

The process of fabricating a semiconductor storage device according to one embodiment of the present invention will be described below.

First, as shown in FIG. 1A, a MOS transistor that serves as the switching transistor 2 and the element isolation region 3 are formed on the silicon substrate 1 according to a known transistor fabricating method. An SiOF film is formed as the first interlayer insulating film 4 on the silicon semiconductor substrate 1, using a BPSG film (Boro-Phospho Silicate Glass film) or silicon tetrafluoride ($SiF_4$) as a raw material.

Next, as shown in FIG. 1A, a contact hole forming resist pattern (not shown in the drawings) is formed through a lithographic process, and thereafter a contact hole is opened by the dry etching method. Next, a polysilicon film is deposited and doped with phosphorus at a temperature of 800 to 900° C. Next, the polysilicon film is polished by chemico-mechanical polishing, thereby forming the polysilicon plug 5 in the contact hole. Next, a Ti film (not shown) is formed to a film thickness of 200 Å as an adhesion layer for the lower electrode 7/barrier metal layer 6.

Figure 1B:
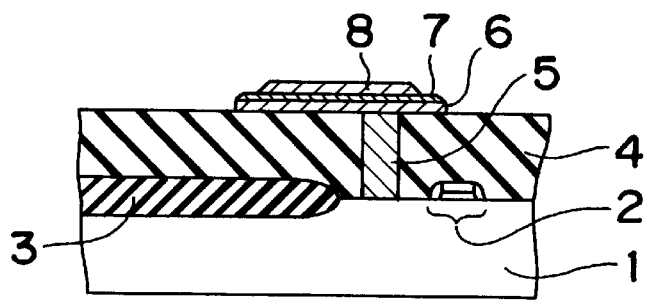

Next, as shown in FIG. 1B, a titanium nitride film or a TaSiN film or a laminate film of these materials are formed by the sputtering method to a thickness of 1000 to 2000 Å as the barrier metal layer 6 between the lower electrode 7 and the polysilicon plug 5. A TiN film was used as the barrier metal layer 6 in the present embodiment. Next, Pt or a compound containing Pt or an oxide electrode of $IrO_2$, $RuO_2$, $ReO_3$ or the like or a laminate film of these materials is formed by the sputtering method to a film thickness of 500 to 1500 Å as the lower electrode 7. A Pt film was used as the lower electrode 7 in the present embodiment.

Next, as shown in FIG. 1B, a PZT film is formed by the sol-gel method to a film thickness of 2000 Å on the lower electrode 7, and the film is crystallized into a perovskite structure having a ferroelectric characteristic by applying heat by means of a lamp or an electric furnace, thereby forming the ferroelectric film 8. The crystallization temperature largely varies depending on the ferroelectric material, and a temperature of 600 to 700° C. is preferable for the PZT film or PLZT film. Next, the ferroelectric film 8, lower electrode 7, barrier metal layer 6, and the adhesion layer are patterned. The film 8 is composed of the PZT film, lower electrode 7 is composed of Pt, barrier metal layer 6 is composed of TiN film, and the adhesion layer is composed of a Ti film. Then, the substrate 1 is subjected to a heat treatment within a temperature range of 300 to 450° C. in an atmosphere of hydrogen or an inert gas containing hydrogen after this patterning. Through these processes, a defect at the interface between the Si semiconductor substrate 1 and the gate oxide film of the switching transistor 2 is vanished by hydrogen.

Figure 2A:
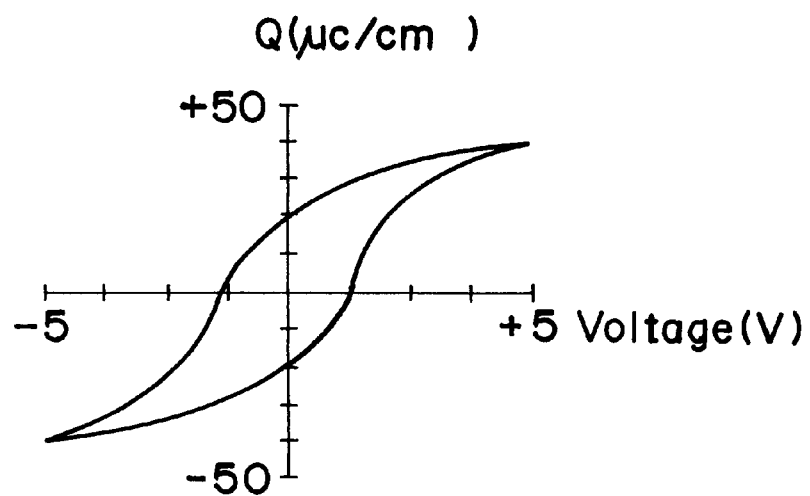
FIG. 2A is a graph showing a hysteresis characteristic of a ferroelectric substance in the case where the ferroelectric substance is subjected to a heat treatment in a hydrogen atmosphere before forming a capacitor upper electrode.
Figure 2B:
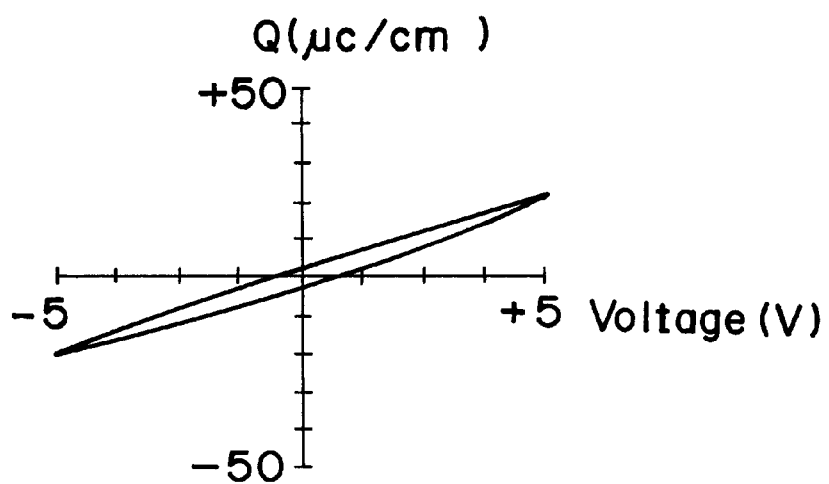
FIG. 2B is a graph showing a hysteresis characteristic of a ferroelectric substance in the case where the ferroelectric substance is subjected to a heat treatment in a hydrogen atmosphere after forming a capacitor upper electrode.
Figure 3:
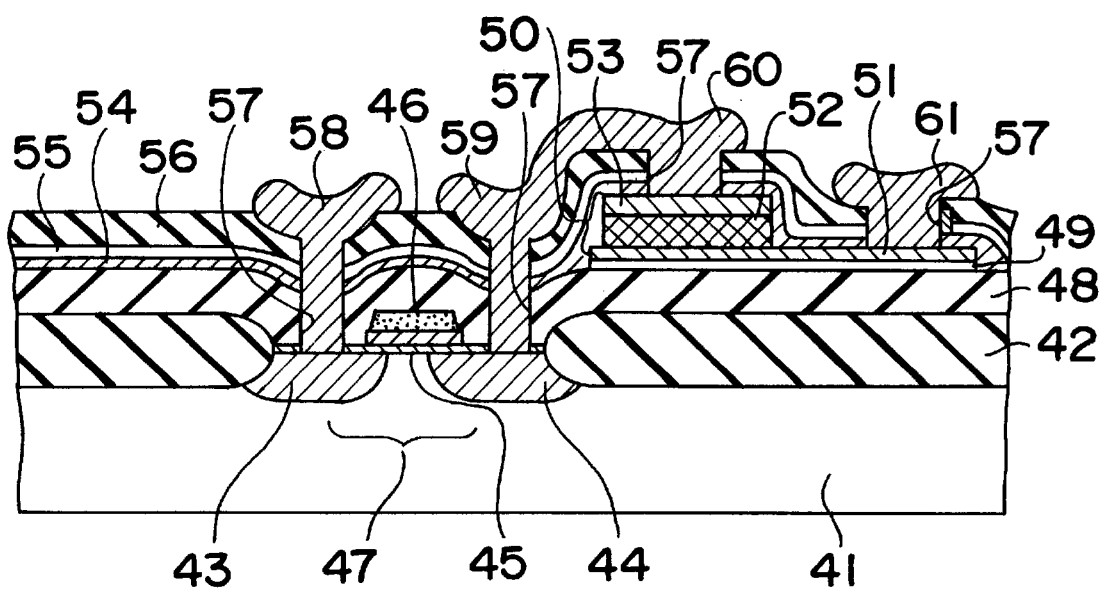
FIG. 3 is a diagram for explaining the process for fabricating a prior art semiconductor storage device.

By thus performing the heat treatment in the inert gas containing hydrogen before forming the upper electrode 10, no deterioration is observed in the ferroelectric characteristic as shown in FIG. 2A. If the processing is performed in the inert gas containing hydrogen after the formation of the upper electrode 10, then the deterioration in the ferroelectric characteristic becomes significant as shown in FIG. 2B.

That is, if the heat treatment is performed in the atmosphere containing hydrogen after the formation of the upper electrode 53 as in the prior art, then it is presumable that the hydrogen is easily absorbed by the upper electrode 53 and reaches the interface of the ferroelectric film 52. Then, the upper electrode 53, and in particular, It has a catalytic effect, and it is presumable that the hydrogen is activated to cause a reducing effect on the ferroelectric film 52 side, consequently pulling out oxygen in the ferroelectric film 52. If this phenomenon progresses, then the ferroelectric characteristic will deteriorate and a leak current will increase. Therefore, in the present embodiment, the heat treatment in the hydrogen atmosphere is executed before the formation of the upper electrode 10 of the capacitor 18. Therefore, according to this embodiment, the defect at the interface between the gate oxide film of the switching transistor 2 and the silicon substrate 1 can be vanished by hydrogen without deteriorating the ferroelectric characteristic through the heat treatment in the gas containing hydrogen. Thereby, the interface state density of the gate oxide film can be reduced. Therefore, the excellent ferroelectric characteristic of the capacitor 18 can be made compatible with the stable characteristics of the transistor 2.

Figure 1C:
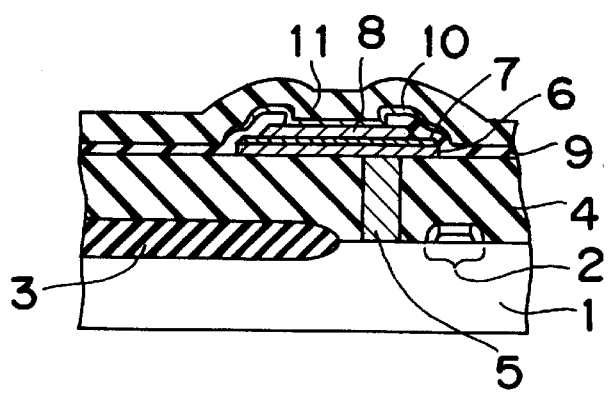

Next, as shown in FIG. 1C, the second interlayer insulating film 9 is formed on the ferroelectric film 8 comprised of a PZT film. This second interlayer insulating film 9 is comprised of an SiOF film formed by the plasma CVD method within a substrate temperature range of normal temperature to 450° C. using $SiF_4$, $O_2$ and Ar as raw materials. Otherwise, the second interlayer insulating film 9 may be comprised of an SiONF film formed within a substrate temperature range of normal temperature to 450° C. using $SiF_4$, $N_2$, $O_2$ and Ar or $N_2O$ as raw materials. The insulating film 9 formed by the above method uses no hydrogen containing gas as the film forming gas, and therefore, no hydrogen (H) exists in the insulating film 9. Therefore, no hydrogen dissociation is caused by the heat treatment, consequently incurring no deterioration in the ferroelectric characteristic.

Next, a contact hole for forming the upper electrode 10 is opened. As the upper electrode 10, Pt is formed to a thickness of about 1000 Å and patterned by a photolithographic process. It is to be noted that the material of the upper electrode 10 is not limited to Pt, and it is acceptable to employ an oxide conductor used for the lower electrode 7 or a laminate electrode of these materials. Also, the upper electrode 10 may be been directly formed on the ferroelectric film 8 , not via the contact hole formed through the insulating film 9.

Next, as shown in FIG. 1C, the third interlayer insulating film 11 is formed on the upper electrode 10 by a method similar to that of the second interlayer insulating film 9.

Figure 1D:
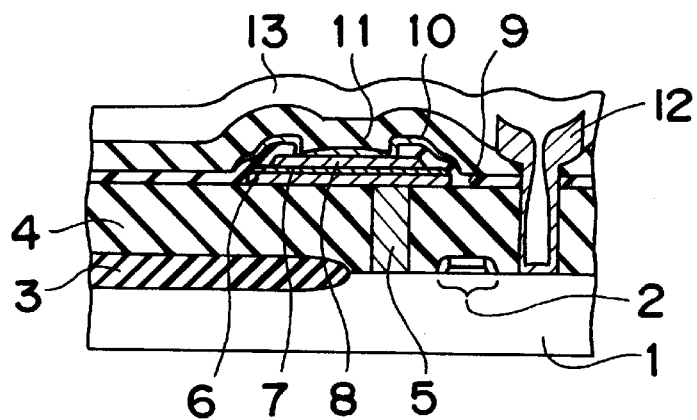

Next, as shown in FIG. 1D, a contact hole is opened on a source of the switching transistor 2, and the metal wiring 12 is formed.

Then, after the formation of this metal wiring 12, an SiOF film for the surface protecting film 13 is formed within a substrate temperature range of normal temperature to 450° C., using $SiF_4$, $O_2$ and Ar as raw materials. Otherwise, an SiNF film for the surface protecting film 13 is formed within a substrate temperature range of normal temperature to 450° C., using $SiF_4$, $N_2$ and Ar as raw materials. Otherwise, an SiONF film for the surface protecting film 13 is formed within a substrate temperature range of normal temperature to 450° C., using $SiF_4$, $N_2$, $O_2$ and Ar or $N_2O$ as raw materials.

Furthermore, the surface protecting film 13 may be provided by a silicon nitride film formed by the plasma CVD method using $SiF_4$ and $N_2$ as raw materials. For the surface protecting film 13, a nitrided oxidized silicon film may be formed using $SiF_4$ and $N_2O$ as material gases. Furthermore, a laminate film of these films may be used as the surface protecting film 13.

After the formation of the surface protecting film 13, a heat treatment is performed within a temperature range of 300 to 450° C. in an atmosphere of an inert gas or oxygen or a mixture gas of these gases.

By this second heat treatment, the damage caused by the plasma introduced during the process of opening the contact hole, processing the metal wiring and forming the surface protecting film 13 can be recovered. Since the heat treatment temperature is set to 300 to 450° C., reaction of aluminum with the silicon semiconductor substrate can be suppressed when aluminum is used for wiring. Accordingly, reliability of the aluminum wiring can be secured. By virtue of the heat treatment performed within the temperature range of 300 to 450° C., the hydrogen that has vanished the defect at the interface between the gate oxide film of the transistor 2 and the substrate 1 is not dissociated. Therefore, the characteristics of the transistor can be stabilized.

Although the PZT film is employed as the ferroelectric film 8 in the aforementioned embodiment, the present invention is not limited to this, and it is acceptable to employ a bismuth layered compound ($SrBi_4Ti_4O_{15}$, $SrBi_2Ta_2O_9$)

The Invention being thus described, it will be obvious that the invention may be varied in many ways. Such variations are not be regarded as a departure form the sprit and scope of the Invention, and all such modifications as would be obvious to one skilled in the art are Intended to be included within the scope of the following claims.

What is claimed is:

1. A semiconductor storage device fabricating method for fabricating a semiconductor storage device provided with a capacitor that uses a ferroelectric film as a dielectric film and a MOS transistor, comprising the steps of:

forming the ferroelectric film on a lower electrode of the capacitor;

performing a first heat treatment in an atmosphere of hydrogen or a mixture of hydrogen and an inert gas after crystallizing the ferroelectric film so that a defect is vanished at an interface between a gate insulating film of the MOS transistor and a semiconductor substrate; and forming an upper electrode of the capacitor on the ferroelectric film directly or via a contact hole formed through an interlayer insulating film after having performed the first heat treatment.

2. A semiconductor storage device fabricating method as claimed in claim 1, wherein the first heat treatment is performed at a temperature of 300 to 450° C.

3. A semiconductor storage device fabricating method as claimed in claim 1, wherein a silicon oxide film containing fluorine or a silicon nitride film containing fluorine or a nitrided oxidized silicon film containing fluorine is formed as the interlayer insulating film by a chemical vapor deposition method using silicon tetrafluoride as a raw material.

4. A semiconductor storage device fabricating method as claimed in claim 1, wherein a second heat treatment is performed in an atmosphere of oxygen, an inert gas or a mixture gas of oxygen and an inert gas after forming the interlayer insulating film.

5. A semiconductor storage device fabricating method as claimed in claim 4, wherein the second heat treatment is performed at a temperature of 300 to 450° C.

6. A semiconductor storage device having a capacitor, said capacitor comprising:

a lower electrode;

a ferroelectric film that is formed on the lower electrode and has an upper surface processed by hydrogen; and an upper electrode on the ferroelectric film.

7. A semiconductor storage device fabricating method for fabricating a semiconductor storage device provided with a capacitor that uses a ferroelectric film as a dielectric film and a MOS transistor, comprising:

forming the device including a semiconductor substrate;

forming a gate insulating film;

forming an interlayer insulating film;

forming a defect between the gate insulating film and the semiconductor substrate;

forming a lower electrode of the capacitor;

crystallizing the ferroelectric film;

forming the ferroelectric film on the lower electrode of the capacitor;

performing a first heat treatment in an atmosphere of hydrogen or a mixture of hydrogen and an inert gas after crystallizing the ferroelectric film so that a defect is vanished at an interface between a gate insulting film of the MOS transistor and a semiconductor substrate; and forming an upper electrode of the capacitor on the ferroelectric film directly or via a contact hole formed through an interlayer insulating film after having performed the first heat treatment.

* * * * *